United States Patent
Kummeth

(10) Patent No.: US 9,691,530 B2
(45) Date of Patent: Jun. 27, 2017

(54) SUPERCONDUCTING COIL DEVICE WITH CONTINUOUS CURRENT SWITCH AND METHOD FOR SWITCHING

(71) Applicant: SIEMENS AKTIENGESELLSCHAFT, München (DE)

(72) Inventor: Peter Kummeth, Herzogenaurach (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 18 days.

(21) Appl. No.: 14/837,759

(22) Filed: Aug. 27, 2015

(65) Prior Publication Data
US 2016/0064128 A1    Mar. 3, 2016

(30) Foreign Application Priority Data
Aug. 29, 2014  (DE) .......................... 10 2014 217 249

(51) Int. Cl.
| | |
|---|---|
| H01F 6/00 | (2006.01) |
| H01F 6/06 | (2006.01) |
| H01F 7/02 | (2006.01) |
| H01F 7/20 | (2006.01) |
| H01F 41/04 | (2006.01) |

(52) U.S. Cl.
CPC ............... *H01F 6/06* (2013.01); *H01F 6/003* (2013.01); *H01F 6/006* (2013.01); *H01F 7/0205* (2013.01); *H01F 7/20* (2013.01); *H01F 41/048* (2013.01)

(58) Field of Classification Search
CPC ........................ H01F 6/00–6/065; H03K 17/92
See application file for complete search history.

(56) References Cited

U.S. PATENT DOCUMENTS 4,021,633 A    5/1977    Kuwabara et al.

FOREIGN PATENT DOCUMENTS

| DE | 37 39 412 A1 | 6/1989 |
|---|---|---|
| DE | 102010042598 A1 | 4/2012 |
| DE | 102014217249.7 | 8/2014 |
| JP | 4-176174 | 6/1992 |
| JP | 2013-74082 | 4/2013 |

OTHER PUBLICATIONS

Office Action for German Appln No. 102014217249.7 dated Apr. 21, 2015.

*Primary Examiner* — Ramon M Barrera
(74) *Attorney, Agent, or Firm* — Slayden Grubert Beard PLLC

(57) ABSTRACT

A coil device with at least one electrical coil winding with superconducting conductor material and a vacuum container is described in which the vacuum container surrounds the coil winding. The coil winding is part of a self-contained circuit for the formation of a continuous current. The closed circuit has a switchable conductor section, the conductor of which can be switched between a superconducting state and a normally conducting state by a magnetic device. The magnetic device has an internal part arranged inside the vacuum container and an external part arranged outside the vacuum container.

17 Claims, 2 Drawing Sheets

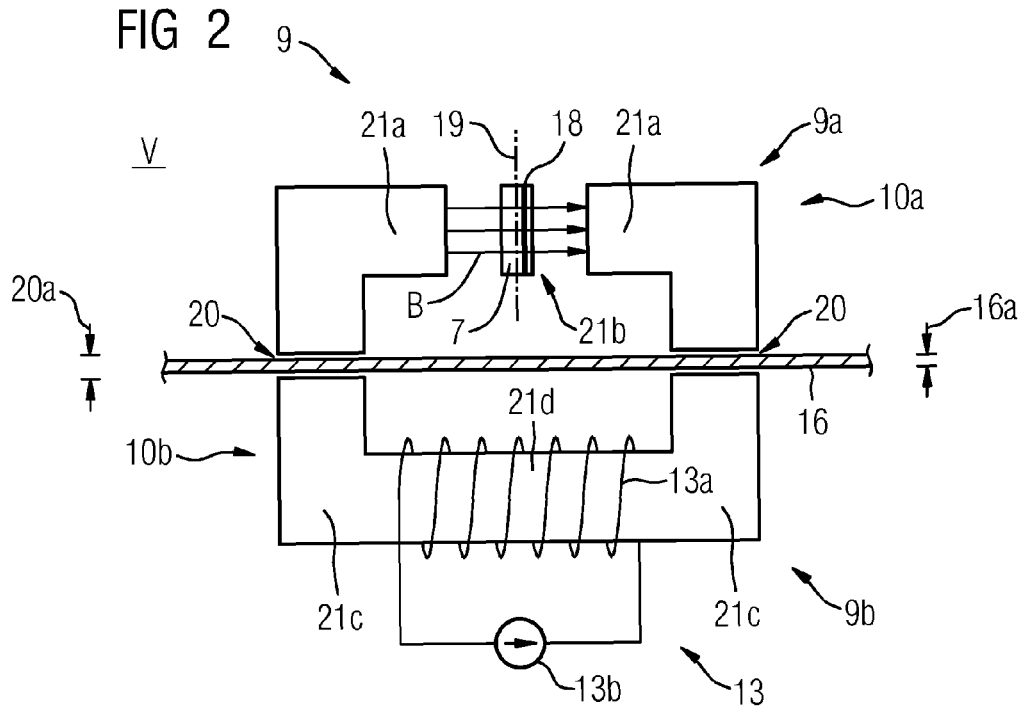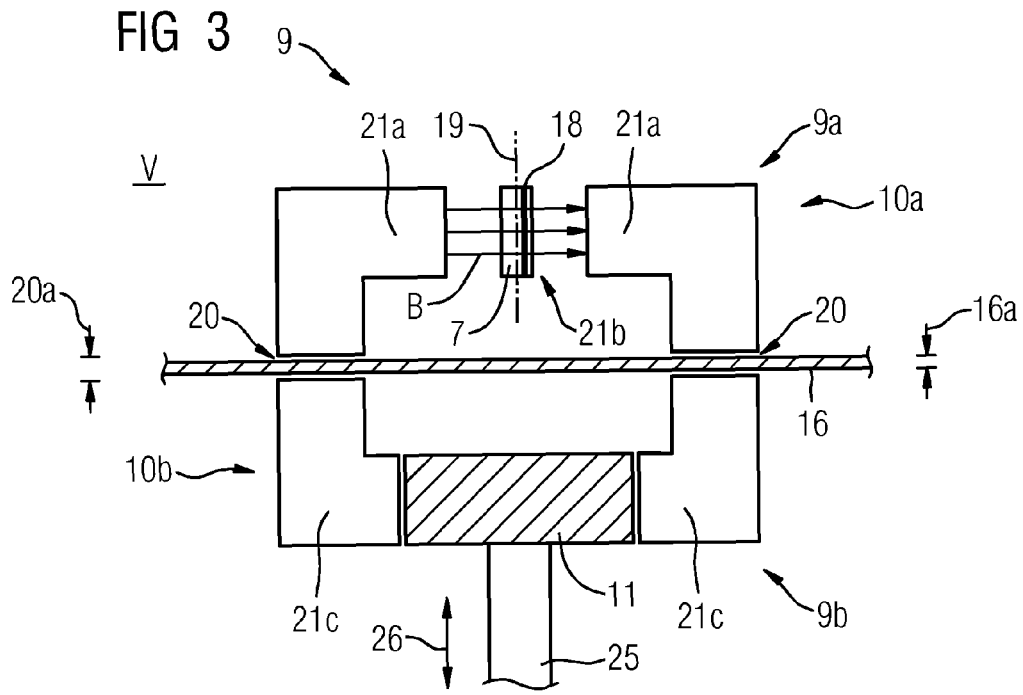

SUPERCONDUCTING COIL DEVICE WITH CONTINUOUS CURRENT SWITCH AND METHOD FOR SWITCHING

CROSS REFERENCE TO RELATED APPLICATIONS

The International Application claims the benefit of German Application No. 10 2014 217 249.7 filed on Aug. 29, 2014, which is incorporated by reference herein in its entirety.

BACKGROUND

Described below is a coil device with at least one electrical coil winding with superconducting conductor material and a vacuum container which surrounds the coil winding, the coil winding being part of a self-contained circuit for the formation of a continuous current.

Superconducting coils are used for the generation of strong, homogenous and temporally stable magnetic fields which are operated in continuous current mode. Homogenous magnetic fields with magnetic flux densities between 0.2 T and 20 T are required, for example, for Nuclear Magnetic Resonance spectroscopy (NMR spectroscopy) and for magnetic resonance imaging. These magnets are typically charged via an external circuit and then separated from the external power source as an almost loss-free current flow takes place via the superconducting coil in the resulting continuous current mode. The resulting strong magnetic field is particularly stable temporally as it is not influenced by the noise contributions of an external circuit.

When using known superconducting coil windings, one or more superconducting wires are wound on supporting bodies, various wire sections being brought into contact with each other via wire connections with the smallest possible ohmic resistance or via superconducting connections. For classic low-temperature superconductors such as NbTi and $Nb_3Sn$ with transition temperatures below 23 K, technologies exist for making superconducting contacts for the linking-up of wire sections and for the connection of windings with a so-called superconducting continuous power switch. The known superconducting continuous power switches are each part of the circuit of the coil and are put into a resistive conducting state for the supply of an external current by heating. After switching off the heating and cooling to the operating temperature, this part of the coil also becomes superconductive again.

High-temperature superconductors or High-$T_c$-Superconductors (HTS) are superconducting materials with a transition temperature of more than 25 K and in the case of some material classes, for example, cuprate superconductors, of more than 77 K, for which the operating temperature can be reached by cooling with other cryogenic materials as liquid helium. HTS materials are particularly attractive for the production of magnetic coils for NMR spectroscopy and magnetic resonance imaging as some materials have high upper critical magnetic fields of more than 20 T. As a result of the higher critical magnetic fields, in principle HTS materials are better suited than low-temperature superconductors to the generation of high magnetic fields of, for example, more than 3 T or even more than 10 T. Regardless of the choice of superconductor material as a high-temperature or low-temperature superconductor, however, the coil winding must be cooled by a cooling system during operation and is expediently arranged inside a vacuum container for this purpose, as a result of which the coil winding is thermally insulated from a warm environment.

A problem with the production of HTS magnetic coils is the lack of suitable technologies for the production of superconducting HTS connections, in particular, for second-generation HTS, so-called 2G HTS. 2G HTS wires are typically available in the form of flat coated conductors. If ohmic contacts are inserted between the superconducting coated conductors, the losses in the coil can no longer be ignored and the magnetic field generated declines markedly within a period of a few hours or days.

DE 10 2010 042 598 A1 specifies a superconducting MR magnet arrangement which has a superconducting coated conductor which is provided with a slit between the two ends in a longitudinal direction, the superconducting coated conductor thus forming a closed loop surrounding the slit. In the magnet arrangement the superconducting coated conductor is wound into at least one double coil having two coil sections which are twisted against each other in such a way that they generate a predetermined magnetic field course in a measurement volume. The subsequent introduction of superconducting connections is unnecessary for such a coated conductor with doubly connected topology. A superconducting continuous power switch may in turn be formed by a heatable local subsection of the conductor loop, this subsection being surrounded by two contacts for connection to an external feed current for feeding a current into the coil winding.

A disadvantage of such a known coil device is that the heatable area of the coated conductor constitutes a weak point at which the coated conductor is particularly susceptible to delamination and other damage. If, for example, damage occurs when fastening the heating, the entire coated conductor is destroyed thereby because no subsequent contacts can be introduced for repair due to the principle of the continuous slotted conductor loop. A further disadvantage is that for the heating additional current supplies are required for connection to a heating circuit, which must be routed from a warm external environment into the environment of the superconductor at a cryogenic temperature. As a result of these additional current supplies, additional paths for thermal losses are created, thus making cooling of the superconducting coated conductor to its operating temperature more difficult. Additional disadvantages result from relatively slow switching behavior and the relatively long conductor areas required for thermal switching.

SUMMARY

The task is therefore to provide a coil device which avoids the aforementioned disadvantages. In particular, a robust coil device should be specified with which the coated conductor is exposed to a low risk of damage during both production and operation. Furthermore, a simply constructed coil device which is easy to cool and which does not require any additional power supplies for connection of the switchable region to an external heating circuit should be constructed, with which switching inside the vacuum container can be achieved as easily as possible. A further task is to provide a switching method for the switching of a conductor section of a superconducting coil device.

The coil device has at least one electrical coil winding with superconducting conductor material and a vacuum container which surrounds the coil winding. The coil winding is part of a self-contained circuit for the formation of a continuous current. The closed circuit has a switchable conductor section the conductor of which can be switched between a superconducting state and a normally conducting state by a magnetic device. The magnetic device has an internal part arranged inside the vacuum container and an external part arranged outside the vacuum container.

A major advantage of the coil device is that a heating device does not need to be attached to this conductor section for switching of the conductor section and current supplies for a heating current do not need to be introduced into the environment of the conductor section, which is at a cryogenic temperature. Instead a superconducting continuous power switch is provided by a magnetic device, by which a magnetic field can be generated in the region of the switchable conductor section, as a result of which switching between a normally conducting state and a superconducting state is enabled. The magnetic device may be expediently designed such that the magnetic field is variable at the site of the switchable conductor section. The strength of the magnetic field in the region of the switchable conductor section can be switched between at least two levels. By increasing the magnetic field, it is then possible to switch from the superconducting state to the normally conducting state, for example, by exceeding the critical magnetic field. Conversely, by lowering the magnetic field, switching from the normally conducting state to the superconducting state can be achieved.

The design of the magnetic device with an internal part arranged in the vacuum container and an additional external part ensures that the magnetic field inside the vacuum container and in particular in the region of the switchable conductor section can be varied by a change in the region of the external part. This bipartite arrangement enables relatively easy switching of the conductor section without the need for complex mechanical moving or electrically switchable components inside the vacuum container. Instead, switching can be advantageously triggered in the external part of the magnetic device.

Expediently, the coil device has at least two contacts for connection of the coil winding to an external feed circuit which are arranged on both sides of the switchable conductor section. Via this feed circuit the coil can, for example, be charged by an external power source. By arranging the switchable conductor section between the contacts, after switching to the normally conducting state—by increasing the magnetic field—feeding of a charging current from the feed circuit to the coil winding is enabled. After this charging, the conductor section can be returned to the superconducting state by reducing the magnetic field again so that the continuous current introduced when charging can then flow in the self-contained circuit of the coil device. The length of the switchable conductor section can in general be advantageously shorter than in the case of a conductor section which is brought to a normally conducting state by heating. As a result of this, the conductor section between the power contacts can generally be shorter in length, and the overall length of non-coiled conductor material required may be less. This makes a more compact embodiment of the coil device possible.

The method serves to switch a conductor section of a coil device between a superconducting state and a normally conducting state, wherein the coil device has at least one electrical coil winding with superconducting conductor material and a vacuum container surrounding the coil winding. The coil winding is part of a self-contained circuit for the formation of a continuous current. The method is wherein the increasing and/or reduction of a magnetic field generated by a magnetic device in the region of the conductor section, wherein the magnetic device has an internal part arranged inside the vacuum container and an external part arranged outside the vacuum container.

The advantages of the method arise analogously to the aforementioned advantages of the coil device. In particular, switching can be advantageously triggered in the external part of the magnetic device. Switching between the superconducting state and the normally conducting state using the described method can in general take place more rapidly than by heating a switchable conductor section.

The described embodiments of the coil device and the switching method can be advantageously combined with each other.

The internal part of the magnetic device may have at least one internal flux guiding element, and the external part of the magnetic device may have at least one external flux guiding element and at least one magnet. With this embodiment, advantageously switching triggered outside the vacuum container can be achieved particularly easily. Expediently, the at least one internal flux guiding element and the at least one external flux guiding element are arranged such that the magnetic device as a whole directs a large part of the magnetic flux generated by the magnet to the switchable conductor section. To this end, the flux guiding elements as a whole have an annular superstructure which can expediently be interrupted in a region surrounding the switchable conductor section. The internal flux guiding element and the external flux guiding element can each be designed as a magnetically soft yoke for this purpose.

At least one internal flux guiding element can in particular have two arms between which the switchable conductor section can be arranged. In other words, the switchable conductor section may be arranged in an aperture of a superior U-shaped structure of the internal part of the magnetic device. This aperture may at the same time be an aperture in an annular superstructure which is formed by the internal flux guiding element in combination with the external flux guiding element. Optionally, the externally arranged magnet may also be part of the annular superstructure.

Advantageously, the internal and external flux guiding elements have a magnetically soft material and may consist of such a magnetically soft material. The magnetically soft material can include iron and/or ferrite and/or an iron alloy. The flux guiding elements may each be formed of one or more solid components, or they may each be formed of a stack of magnetically soft sheets electrically insulated from each other or they may be formed of powder which is sintered or embedded in a sealing compound. The magnetically soft material may advantageously have a relative permeability of at least 4, particularly advantageously at least 30.

The magnet may be a permanent magnet. With this embodiment, the permanent magnet is expediently part of the aforementioned annular superstructure via which the flux guiding elements direct the magnetic flux to the region of the switchable conductor section. Switching the conductor section between a superconducting state and a normally conducting state can then, for example, be advantageously achieved by moving the permanent magnet relative to at least one of the flux guiding elements. To this end, for switching to the normally conducting state the permanent magnet may, for example, be moved such that it then forms part of the annular superstructure. The magnetic flux which is directed from the magnetic device to the inside of the vacuum container is significantly increased by movement into this position. In particular, with an arrangement of the switchable conductor section in an aperture of the annular structure, the magnetic field thus formed may result in a collapse of the superconducting properties.

Conversely, the permanent magnet for switching back to the superconducting state can be moved such that it is removed from the annular superstructure again. Thereby, a reduction of the magnetic field inside the vacuum container and in particular at the site of the switchable conductor section can be achieved, as a result of which the superconducting properties can be restored.

Alternatively, the magnet may be an electromagnet. With this embodiment the magnet can, for example, have an electrical coil winding which is arranged around a magnetically soft core. This magnetically soft core can expediently form part of the external flux guiding element, via which the resulting magnetic field in combination with the internal flux guiding element geometrically connected thereto can be directed to the site of the switchable conductor section. With this embodiment, switching of the switchable conductor section can be brought about by activation and deactivation (or alternatively also increasing and lowering) of a current flowing in the electrical coil winding. With an increase of the current, a greater magnetic field is generated at the site of the switchable conductor section, and the superconducting properties may cease. Conversely, the superconducting properties may be restored if the current is reduced as a consequence of the resulting lowering of the magnetic field. This embodiment also permits simple switching of the conductor section arranged in the vacuum container, which is triggered outside the vacuum container. In particular, all the electrical components required for the electromagnet can be arranged outside the vacuum container, and no additional power supplies are required to the inside of the vacuum container. With this embodiment furthermore, with the magnetic device mechanically moving parts can be advantageously avoided both inside as well as outside the vacuum container as no mechanical movement is required for switching in the external part, only electrical switching.

The internal part of the magnetic device can be fixed in the vacuum container. This embodiment is expedient as both in the case of the version with a permanent magnet and in the case of the version with an electromagnet, switching does not need to be triggered by a mechanical movement inside the vacuum container. Thus, mechanically moving parts of the magnetic device inside the vacuum container can be completely omitted. In the case of the embodiment with a permanent magnet, a movement of the permanent magnet or the external flux guiding element (or part thereof) is sufficient to alter the magnetic field in the region of the switchable conductor section. In the case of the embodiment with an electromagnet, on the other hand, no mechanical movements at all are required for switching.

At least in the region of the magnetic device, the vacuum container may have an external wall of a non-magnetic material. This is particularly advantageous for enabling connection of the magnetic flux with the least possible interaction with the external wall from the external flux guiding element to the internal flux guiding element. Non-magnetic materials here are understood to mean all materials which are not ferromagnetic or ferrimagnetic. Materials with $\mu_r$ relative permeability below 4 should generally be deemed non-magnetic in this connection. Non-magnetic materials with relative permeability below 2 can be used particularly advantageously.

Advantageously, the thickness of the external wall of the vacuum container may be 2 mm maximum in order to keep the distance between the internal flux guiding element and the external flux guiding element as small as possible. This distance may advantageously be less than 3 mm, wherein this upper limit should apply to both the gaps of the annular superstructure for each of which internal and external flux guiding elements are arranged in close physical proximity and are separated from each other by the external wall.

The coil device, in particular, the switchable conductor section, may advantageously have a superconducting coated conductor. Particularly advantageously, the electrical conductor of the coil winding may also be designed as a superconducting coated conductor. In particular, the self-contained circuit may essentially be superconducting coated conductor material. The coated conductor may have a high-temperature superconducting layer, in particular, a compound of the REBa2Cu3Ox type, RE standing for a rare earth element or a mixture of such elements. Alternatively, the superconducting layer of the coated conductor may, for example, include magnesium diboride.

In the case of an embodiment with a superconducting coated conductor, the magnetic device may be vertical to the plane of the coated conductor in the region of the switchable conductor section for the formation of a magnetic field with a directional component. The generated magnetic field may display an angle of less than 45 degrees to the normal plane, in particular, even less than 30 degrees, in an area of the switchable conductor section. Particularly advantageously, the magnetic field may be vertical or at least almost vertical to the coated conductor plane, at least in a subsection of the switchable conductor section.

Such an embodiment with a high directional component of the magnetic field vertical to the coated conductor surface is particularly advantageous in combination with a coated conductor with a high-temperature superconducting layer of the $REBa_2Cu_3O_x$ type. Such a layer may have a crystalline structure of the Perowskit type, wherein its crystallographic c-axis may essentially be vertical to the layer plane or may at least have a high directional component vertical to the layer plane. In the case of orientation of the magnetic field with a high directional component parallel to the c-axis, a strong dependence of the superconducting properties on the strength of the magnetic field can be achieved.

The superconducting coated conductor may be a bifurcated coated conductor with doubly connected topology. The definition of the term "doubly connected" in geometric topology is here understood to mean that the coated conductor has the topology of a simple loop with a hole. Such a doubly connected coated conductor may be produced by slitting a singly connected coated conductor in a longitudinal direction, resulting in two conductor branches which are connected at both ends of the original strip. By repeated slitting in a longitudinal direction, a doubly connected coated conductor with more than two conductor branches may also be formed and used accordingly. With this embodiment, a closed circuit with continuous superconducting material can easily be made available without subsequent insertion of contact points. The switchable conductor section may, for example, particularly advantageously be a section in the region of the unslit conductor end—if this switchable region extends to the start of the slit—or it may be a section of the slit coated conductor adjacent to this conductor end.

By magnetic switching of a subsection of the doubly connected conductor loop, a superconducting continuous power switch may be made available particularly easily, likewise without requiring subsequent contacts inside the closed circuit. Contacts for connection to an external feed circuit may be expediently attached to both sides of the switchable region. The attachment of a heating device and thermal loading during its operation may be avoided, however, and the typically relatively sensitive coated conductor material is spared further mechanically stressful process steps.

The contacts for connection to an external feed current are expediently arranged on both sides of the switchable region but must not be immediately adjacent to this. They may also be advantageously located on both unslit ends of the slit conductor. Large conductor areas for the contacts are available there. Furthermore, the power contacts there can be attached at a safe distance from the slit conductor with a smaller width.

The coil device may advantageously have a continuous superconducting conductor which extends over the entire closed circuit. With such a continuous superconducting conductor, the coil device can be operated particularly advantageously in continuous current mode without the current decaying significantly over the operating period. For this purpose, the entire ohmic resistance of the closed circuit may advantageously be no more than 5 nOhm, particularly advantageously no more than 0.05 nOhm. With the aforementioned topology with a slit, doubly connected coated conductor, such a continuous superconducting circuit can be achieved particularly easily.

The switchable conductor section may advantageously adjoin a radially external region of the coil winding. This is particularly expedient if the switchable conductor section itself is not part of the coil winding. Alternatively, it may also be in a radially external region of the coil winding if the switchable conductor section itself is part of the coil winding. Generally, an arrangement of the switchable conductor section at least in the vicinity of radially external parts of the coil winding is advantageous in order to enable the connection of the switchable conductor section to the conductor regions of the actual coil winding to be as short as possible and at the same time to ensure that access to the switchable conductor section is as free as possible. Such free geometric access to this switchable conductor section is important, for example, in order to specifically generate a magnetic field in the region of this conductor section from which the remaining part of the electrical conductor, in particular in the region of the actual coil winding, remains shielded or unaffected. The coil winding may, for example, be a cylindrical coil winding with any (i.e. including non-circular) surface area, with which the radially external regions are geometrically more accessible for connection to a continuous power switch than the radially internal regions.

The method for switching a conductor section may be such that the magnetic field in the external part of the magnetic device is generated by a permanent magnet or an electromagnet. Advantageously, switching can then be triggered in the external part of the magnetic device. Mechanically moving and/or electrically switchable parts may then be omitted in the internal part of the magnetic device.

In general, increasing the magnetic field in an initial step may lead to a reduction of the critical current density in the superconducting state of the conductor section, and in a subsequent step the supply of a current from an external feed circuit may lead to the achievement of the normally conducting state of the conductor section. The strength of the applied magnetic field can therefore be measured in such a way that superconductivity is not yet fully suppressed by this magnetic field. When connecting an external power source of a feed circuit, the power then branches off first so that a portion flows through the superconducting coil winding and a further not inconsiderable portion flows through the switchable conductor section.

On the other hand, however, the magnetic field may nevertheless be so strong that the critical current density is so greatly reduced that when the portion of the feed current described flows, the superconductivity collapses in a second stage as a result of exceeding this critical current density and during supply a normally conducting state is achieved under the influence of the magnetic field. After termination of the current feed and after subsequent lowering of the magnetic field, the superconducting state is achieved again in turn for operation in continuous current mode. With this embodiment described, switching between the normally conducting and superconducting state therefore occurs as a result of a combination of the influence of the altered magnetic field and the current flowing in the switchable conductor section at the respective time.

Switching of the conductor section can be carried out at an operating temperature of the conductor section of between 15 K and 77 K (for example, with a conductor based on magnesium diboride), particularly advantageously between 50 K and 77 K (for example, with solid oxide high-temperature superconductors). This embodiment is particularly advantageous as at such relatively high operating temperatures switching can be achieved relatively easily by magnetic fields which are not overly strong. At lower temperatures, on the other hand, stronger magnetic fields are necessary to bring about switching to a normally conducting state. The magnetic flow density generated by the magnetic device in the region of the switchable conductor section may generally be, for example, up to 3 T. When operating the coil device at higher temperatures, advantageously it may only be at values in the region of up to 2 T. The operating temperature for subsequent continuous operation of the coil device can advantageously be set lower than the operating temperature for the switching operation. Thus, for switching to the normally conducting state for supply of the current, a higher temperature, for example between 50 K and 77 K, may be selected to facilitate switching by a magnetic field. For continuous operation, the superconductor as a whole may then be cooled to a lower temperature.

BRIEF DESCRIPTION OF THE DRAWINGS

These and other aspects and advantages will become more apparent and more readily appreciated from the following description of exemplary embodiments with reference to the accompanying drawings of which:

FIG. 2 is a transverse diagrammatic view of the coil device in the region of the magnetic device of the first exemplary embodiment and FIG. 3 is a diagrammatic view of the coil device in the region of the magnetic device of a second exemplary embodiment.

DETAILED DESCRIPTION OF THE PREFERRED EMBODIMENT

Figure 1:
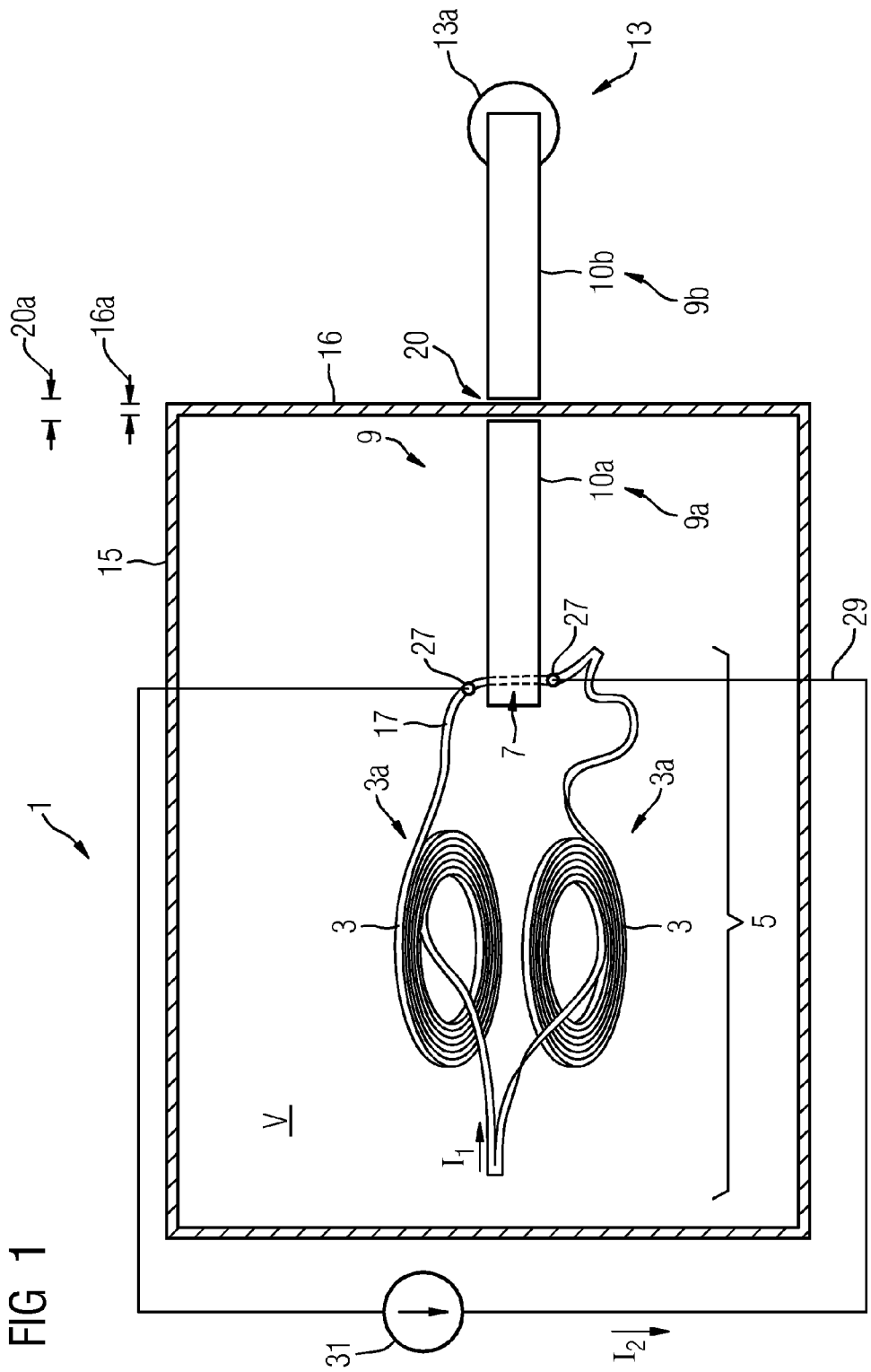
FIG. 1 is a longitudinal diagrammatic view of a coil device according to a first exemplary embodiment.

Reference will now be made in detail to the preferred embodiments, examples of which are illustrated in the accompanying drawings, wherein like reference numerals refer to like elements throughout.

FIG. 1 shows a longitudinal diagrammatic view of a coil device 1 according to a first exemplary embodiment. An arrangement of two electrical coil windings 3 which are electrically connected to each other by a self-contained circuit 5 is shown. Both of the coil windings 3 in this example have a circular cylindrical design and are coaxially arranged so that the magnetic fields generated as a result of a continuous current $I_1$ in circuit 5 mutually reinforce each other. The coil device can thus be used for the generation of a magnetic field, for example, for applications in magnetic resonance imaging or magnetic resonance spectroscopy. In the example shown, the complete closed circuit 5 is formed by a continuous superconducting conductor material, here a coated conductor 17 with a superconducting layer of solid oxide material. The coated conductor 17 has a doubly connected topology and can be produced by slitting an individual strip, the two end regions remaining connected and a closed loop being formed. At an operating temperature of the coated conductor 17 below the transition temperature of the superconducting material, a closed circuit 5 with a continuous superconducting conductor is therefore produced, and the total ohmic resistance of this circuit is extremely low. If this circuit is charged with a continuous current $I_1$, this can flow for a long time without appreciable decay, enabling a temporally highly constant magnetic field to be generated with the coil device 1.

Both of the coil windings 3 and the other parts of the coated conductor 17 connecting these are arranged inside a thermally insulating vacuum container 15, whereby cooling to an operating temperature of the superconductor is facilitated. The superconducting conductor parts can be cooled to a cryogenic operating temperature using a cooling device not shown in more detail here.

To achieve an operational state of the coil device 1, the circuit 5 must be charged with a current. For this purpose, the circuit 5 is connected by two power contacts 27 to a feed circuit 29 only indicated diagrammatically here. A feed current $I_2$ is fed into the circuit 5 by a power source 31. A switchable conductor section 7 of the coated conductor 17 is moved to a normally conducting state during supply so that this current $I_2$ does not distribute itself evenly to the two sub-branches between the contacts 27. The second sub-branch of the circuit 5 remains superconductive, on the other hand, so that the feed current essentially flows via the coil windings 3 as a result of the resistance difference. After switching the switchable conductor section 7 back to the superconducting state, a closed ring current is produced over the entire closed circuit 5. After this charging process, the connection to the feed circuit 29 can be interrupted.

With the coil device 1, switching between the superconducting state and the normally conducting state of the conductor section 7 takes place as a result of the action of a magnetic field B which is generated by a magnetic device 9. The switchable conductor section 7 is arranged adjacent to the conductor end radially external with regard to the coil windings 3 as this region is geometrically relatively freely accessible. Furthermore, the switchable conductor section is adjacent to one of the endpieces of the slit coated conductor still connected as this connected endpiece is not wound up and a freely accessible end region remains here. However, the switchable conductor section is advantageously an already slit section approximately half the width of the original coated conductor material. Switching in the region of such a split conductor branch is advantageous in contrast to the still connected endpiece as the normally conducting state can be achieved more easily with a narrower conductor with a lower current carrying capacity. As an alternative to the example shown, the end region of the coated conductor 17 still connected together with areas of its two adjacent slit subconductors can also form the switchable conductor section. The power contacts 27 are each then attached to a conductor branch of the slit coated conductor loop.

The magnetic device 9 of the first exemplary embodiment shown in FIG. 1 has an internal part 9a arranged inside the vacuum container 15 and an external part 9b arranged outside the vacuum container 15. The internal part 9a has an internal flux guiding element 10a, and the external part 9b has an external flux guiding element 10b and a magnet which in this example is designed as an electromagnet 13.

In FIG. 2 the detailed design of the magnetic device 9 of the first exemplary embodiment is shown in diagrammatic cross-section. This cross-section is a view vertical to the image plane of FIG. 1 and horizontal to the external wall 16 of the vacuum container 15. In this example, the internal part 9a of the magnetic device 9 has a flux guiding element 10a with two flux guiding arms 21a between which there is an aperture 21b. The arms 21a of the internal flux guiding element 10a are made of magnetically soft material, in this example they are designed as solid components of a magnetically soft iron alloy.

The embodiment of the internal flux guiding element 10a with two arms 21a and an intermediate aperture 21b shown enables a concentration of the magnetic field B generated by the magnetic device 9 in this aperture 21b, inside which the coated conductor of the switchable conductor section 7 is arranged. The coated conductor is arranged inside the aperture 21b such that the magnetic field B in the region of the coated conductor is essentially vertical to the plane 19 of the coated conductor. As a result of this orientation, a particularly strong influence of the magnetic field on the superconducting properties of the conductor section 7 is achieved.

As shown in more detail in FIG. 2, the external part 9b of the magnetic device of the first exemplary embodiment has an external flux guiding element 10b and an electromagnet 13. The electromagnet 13 has an electrical coil winding 13a which is wound around a magnetically soft core 21d which itself constitutes a section of the external flux guiding element 10b. This magnetically soft core is arranged between two adjacent arms 21c together with which it forms a U-shaped structure. The coil winding 13a is connected to a power source 13b so that when current is flowing in the coil winding inside the core 21d a magnetic field is generated which is directed via the other parts of the external flux guiding element 10b and via the internal flux guiding element 10a to the site of the switchable conductor section 7. In this example, switching of the switchable conductor section 7 can therefore be achieved particularly easily by changing the current flowing in the external magnetic coil 13a of the electromagnet 13 without mechanically moving parts being required and without electrical switching being required inside the vacuum container 15. The magnetic flux generated externally by the electromagnet 13 is only relayed to the inside of the vacuum container 15 by the interaction of the external flux guiding element 10b and the internal flux guiding element 10a. After charging the closed circuit 5 with a continuous current $I_1$, for example, the external power source 13b can be completely deactivated. Alternatively or in addition, the external part 9b of the magnetic device may also be removed from the coil device 1 in whole or in part for further operation.

To enable the most effective relaying possible of the magnetic flux to the site of the switchable conductor section 7, the internal flux guiding element 10a and the external flux guiding element 10b are designed such that together they form an annular superstructure which in this example is only interrupted in two places by the external wall 16 of the vacuum container and in addition at one place by the aperture 21b, inside which the coated conductor is arranged. In order to enable smooth connection of the magnetic flux to the inside of the vacuum container, the external wall 16 is as thin as possible, for example, with a thickness 16a of less than 2 mm. At least in the area shown, in which the internal flux guiding element 10a and external flux guiding element 10b are closely adjacent, the external wall 16 is made of a non-magnetic material. The example shown involves a non-magnetic steel alloy. In both the transition zones in which the magnetic flux is fed through the external wall 16, there is a gap 20 between each of the two flux guiding elements 10a and 10b, the width of which is less than 3 mm in this example.

In the example of FIG. 2, the magnetic field B is so strong that the critical magnetic flow density of the superconducting layer 18 of the coated conductor is exceeded and the superconductivity already collapses without an additional current flow. A normally conducting state is therefore achieved by the magnetic field B and the aforementioned supply of a continuous current is enabled. Alternatively, however, the magnetic field alone can initially result in a reduction of the critical current density with a still superconducting state of the coated conductor. As a result of connection to a feed circuit 29 and its external power supply 31, on the one hand the feed current $I_2$ initially divides itself up between the switchable conductor section 7, and on the other hand, the path over the coil windings 3. As a result of the current component flowing over the conductor section 7, the reduced critical current density through the magnetic field B may be exceeded, which in a second stage leads to achievement of the normally conducting state of the conductor section 7 and enables the supply of an annularly flowing continuous current to the coil device.

FIG. 3 shows a similar diagrammatic cross-section of a magnetic device 9 according to a second exemplary embodiment. The other parts of the coil device 1 are similar to the first exemplary embodiment shown in FIG. 1. The magnetic device 9 of the second exemplary embodiment differs above all in that its magnet is not designed as an electromagnet but as a permanent magnet 11. The permanent magnet 11 is also arranged outside the vacuum container 15 here. Besides the permanent magnet 11, the external part 9b of the magnetic device also has an external flux guiding element which here includes two arms 21c which together with the permanent magnet form a U-shaped superstructure. The internal part 9a of the magnetic device is designed analogously to the first exemplary embodiment shown in FIG. 2 so that the internal flux guiding element relays the magnetic field generated by the permanent magnet 11 analogously after connecting the inside of the vacuum container to the site of the switchable conductor section 7.

Switching between the two states of the switchable conductor section 7 takes place in the second exemplary embodiment not by electrical switching but by moving the permanent magnet 11 relative to other parts of the magnetic device 9. For this purpose, the permanent magnet 11 in the example shown is connected to an element of motion 25 via which the magnet can move along a direction of movement 26 relative to the fixed external flux guiding element 10b. In the case of the position shown in FIG. 3, the permanent magnet is arranged such that it forms an annular superstructure together with the external and internal flux guiding elements 10a and 10b, which in this example is only interrupted by the two gaps 20 in the region of the external wall 16, by the aperture 21b of the internal flux guiding element and by small distances on both sides between the permanent magnet 11 and the adjacent arms 21c. The annular superstructure is thus suitable for effectively directing the magnetic field generated by the permanent magnet to the site of the switchable conductor section. The position of the permanent magnet 11 shown in FIG. 3 therefore corresponds to a state in which the magnetic field B is strong at the site of the coated conductor and the switchable region is in a normally conducting state. After the supply of a continuous current $I_1$ to the closed circuit 5, the permanent magnet 11 can be retracted or removed from this annular superstructure with the aid of the element of motion 25 such that the magnetic field at the site of the switchable conductor section 7 becomes weaker and a superconducting state can be achieved. For continuous operation of the coil device 1 after completed supply, the permanent magnet 11 or alternatively also the entire external part 9b of the magnetic device can then be removed. With alternative embodiments, the permanent magnet 11 can be permanently connected to the external flux guiding element 10b for this purpose and be moved together with this as a whole via a shared element of motion relative to the internal part 9a of the magnetic device.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

What is claimed is:

1. A coil device, comprising:
    a self-contained circuit for the formation of a continuous current including at least one electrical coil winding with superconducting conductor material, and a switchable conductor section having a conductor switchable between a superconducting state and a normally conducting state;
    a vacuum container surrounding the at least one electrical coil winding; and
    a magnetic device, switching the switchable conductor section of the self-contained circuit between the superconducting state and the normally conducting state, the magnetic device having an internal part arranged inside the vacuum container and an external part arranged outside the vacuum container;
    wherein the internal part of the magnetic device has at least one internal flux guiding element, and wherein the external part of the magnetic device has at least one external flux guiding element and at least one magnet.

2. The coil device as claimed in claim 1, wherein the at least one magnet includes a permanent magnet.

3. The coil device as claimed in claim 1, wherein the at least one magnet includes an electromagnet.

4. The coil device as claimed in claim 1, wherein the internal part of the magnetic device is fixed in the vacuum container.

5. The coil device as claimed in claim 1, wherein the vacuum container has an external wall of a non-magnetic material at least adjacent the magnetic device.

6. The coil device as claimed in claim 1, wherein the superconducting conductor material includes a superconducting coated conductor.

7. The coil device as claimed in claim 6, wherein the magnetic device has a directional component substantially perpendicular to a plane of the superconducting coated conductor in a region including the switchable conductor section where a magnetic field is formed by the magnetic device.

8. The coil device as claimed in claim 7, wherein the superconducting coated conductor is a bifurcated coated conductor with a doubly connected topology.

9. The coil device as claimed in claim 6, wherein the superconducting coated conductor is a bifurcated coated conductor with a doubly connected topology.

10. The coil device as claimed in claim 1, wherein the superconducting conductor material continuously extends over all of the closed circuit.

11. The coil device as claimed in claim 1, wherein the switchable conductor section adjoins a radially external region of the coil winding.

12. A method for switching a conductor section of a coil device between a superconducting state and a normally conducting state, the coil device including at least one electrical coil winding with superconducting conductor material and a vacuum container surrounding the coil winding, the coil winding being part of a self-contained circuit for formation of a continuous current, the method comprising:
at least one of increasing and lowering of a magnetic field generated by a magnetic device in a region including the conductor section;
the magnetic device having an internal part arranged inside the vacuum container and an external part arranged outside the vacuum container;
wherein the internal part of the magnetic device has at least one internal flux guiding element, and wherein the external part of the magnetic device has at least one external flux guiding element and at least one magnet.

13. The method as claimed in claim 12, wherein the magnetic field in the external part of the magnetic device is generated by a permanent magnet or an electromagnet.

14. The method as claimed in claim 12, wherein application of the magnetic field initially results in a reduction of a critical current density in the superconducting state of the conductor section and subsequently results in supply of a current from an external feed circuit for achievement of the normally conducting state of the conductor section.

15. The method as claimed in claim 14, wherein switching of the conductor section is achieved at an operating temperature of between 15 K and 77 K.

16. The method as claimed in claim 13, wherein switching of the conductor section is achieved at an operating temperature of between 15 K and 77 K.

17. The method as claimed in claim 12, wherein switching of the conductor section is achieved at an operating temperature of between 15 K and 77 K.

* * * * *